(12) United States Patent
Mignot et al.

(10) Patent No.: US 10,395,936 B2
(45) Date of Patent: Aug. 27, 2019

(54) WAFER ELEMENT WITH AN ADJUSTED PRINT RESOLUTION ASSIST FEATURE

(71) Applicant: International Business Machines Corporation, Armonk, NY (US)

(72) Inventors: Yann A. Mignot, Slingerlands, NY (US); Muthumanickam Sankarapandian, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/495,186

(22) Filed: Apr. 24, 2017

(65) Prior Publication Data

US 2018/0308703 A1    Oct. 25, 2018

(51) Int. Cl.

| | |
|---|---|
| *H01L 21/02* | (2006.01) |
| *H01L 21/027* | (2006.01) |
| *H01L 21/308* | (2006.01) |
| *H01L 21/311* | (2006.01) |
| *H01L 21/768* | (2006.01) |
| *H01L 23/544* | (2006.01) |

(52) U.S. Cl.
CPC ...... *H01L 21/3081* (2013.01); *H01L 21/0276* (2013.01); *H01L 21/02164* (2013.01); *H01L 21/3085* (2013.01); *H01L 21/3086* (2013.01); *H01L 21/31116* (2013.01); *H01L 21/31138* (2013.01); *H01L 21/768* (2013.01); *H01L 23/544* (2013.01); *H01L 2223/54426* (2013.01)

(58) Field of Classification Search
CPC .......... H01L 21/3081; H01L 21/31138; H01L 21/0276; H01L 21/3086; H01L 21/31116

USPC ................. 257/618, 98; 430/5; 438/695, 22
See application file for complete search history.

(56) References Cited

U.S. PATENT DOCUMENTS

| | | |
|---|---|---|
| 6,194,249 B1 | 2/2001 | Chen et al. |
| 7,091,621 B1 | 8/2006 | Eppes |
| 8,063,412 B2 | 11/2011 | Tsuno |
| 8,321,828 B2 | 11/2012 | Chern |

(Continued)

FOREIGN PATENT DOCUMENTS

EP    0993030 A2    4/2000

OTHER PUBLICATIONS

List of IBM Patents or Patent Applications Treated as Related; (Appendix P), Filed Nov. 13, 2017, 2 pages.

(Continued)

*Primary Examiner* — Bo Fan
(74) *Attorney, Agent, or Firm* — Cantor Colburn LLP; Vazken Alexanian

(57) ABSTRACT

A wafer element fabrication method is provided. The wafer element fabrication method includes forming a device element on a substrate such that the device element includes an upper surface and a sidewall extending from the upper surface to the substrate. The wafer element fabrication method further includes forming an adjusted print resolution assist feature (APRAF) on the substrate such that the APRAF is smaller than the device element in at least one dimension. In addition, the wafer element fabrication method includes depositing surrounding material, which is different from materials of the APRAF, to surround the APRAF and to lie on the upper surface in abutment with the sidewall of the device element.

10 Claims, 3 Drawing Sheets

(56) References Cited

U.S. PATENT DOCUMENTS

| | | |
|---|---|---|
| 2002/0043700 A1 | 4/2002 | Asaki et al. |
| 2005/0087878 A1 | 4/2005 | Uesugi et al. |
| 2005/0136340 A1* | 6/2005 | Baselmans .......... G03F 7/70433 430/5 |
| 2007/0087067 A1 | 4/2007 | Yuan et al. |
| 2007/0269929 A1 | 11/2007 | Liao et al. |
| 2008/0099884 A1 | 5/2008 | Inohara |
| 2015/0221824 A1* | 8/2015 | Hatta .................. H01L 21/0237 257/98 |
| 2015/0325531 A1 | 11/2015 | Dyer et al. |
| 2016/0276237 A1 | 9/2016 | Lin et al. |
| 2016/0293884 A1* | 10/2016 | Zhang ................ H05B 33/0896 |

OTHER PUBLICATIONS

Yann A. Mignot et al., "Wafer Element With an Adjusted Print Resolution Assist Feature", U.S. Appl. No. 15/811,111, filed Nov. 13, 2017.

* cited by examiner

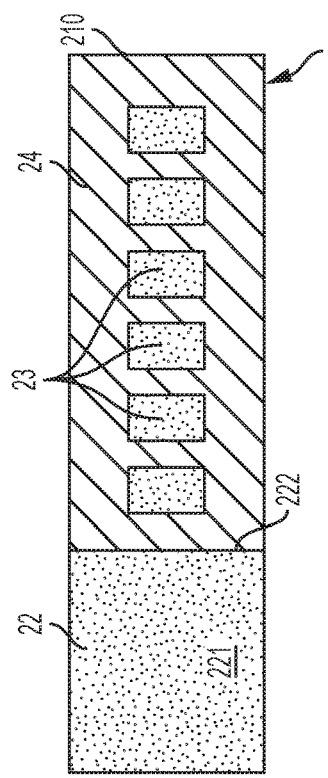
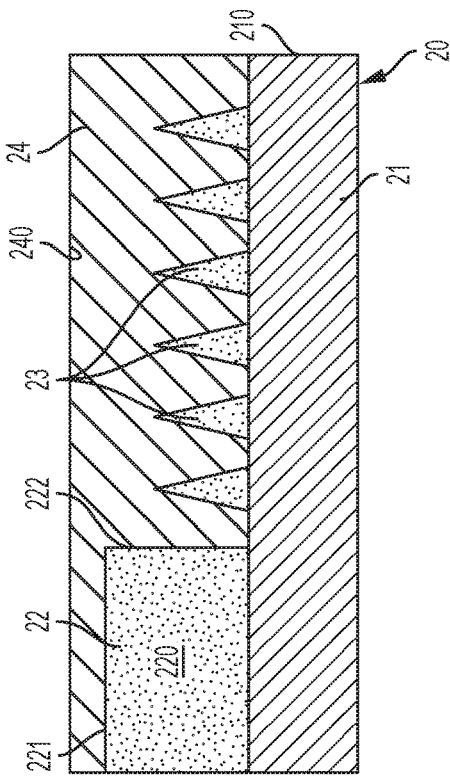
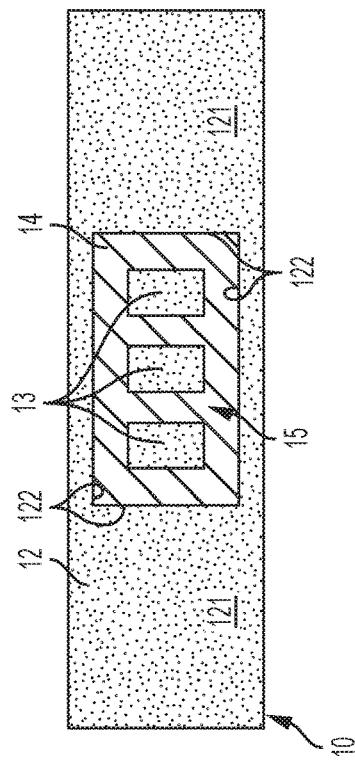
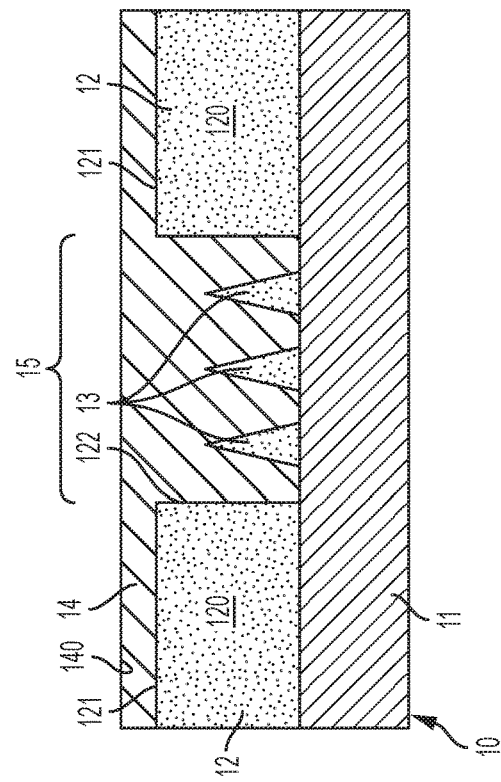
FIG. 1
FIG. 2
FIG. 3
FIG. 4

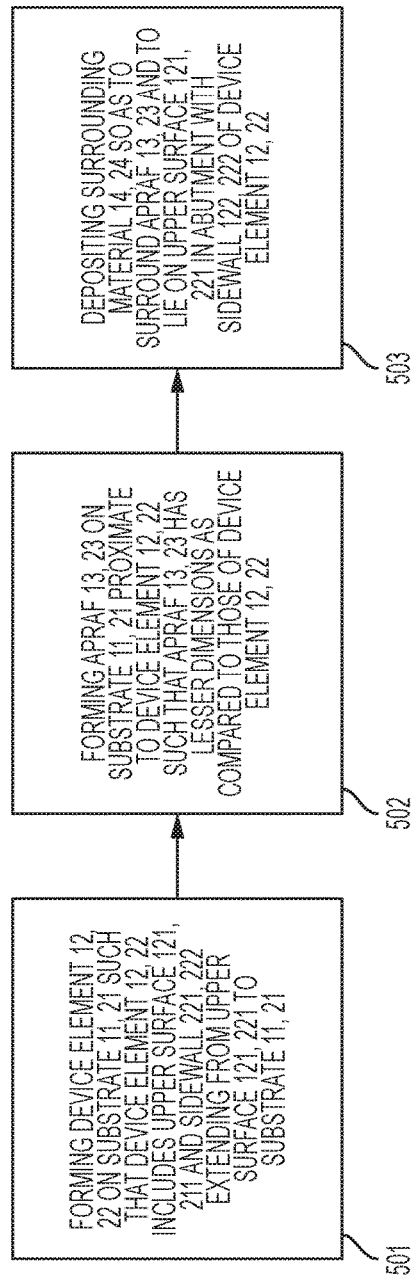
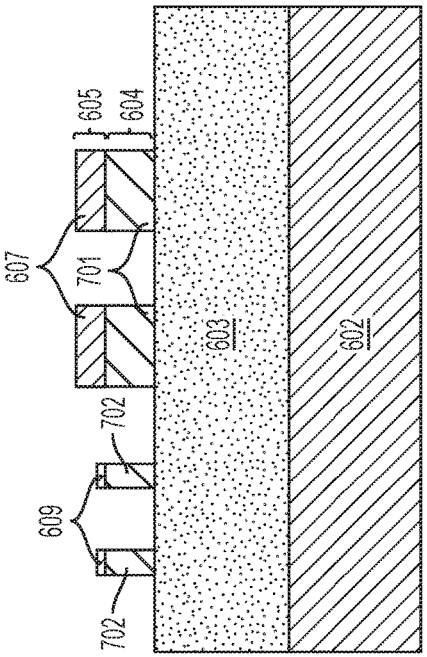
FIG. 7
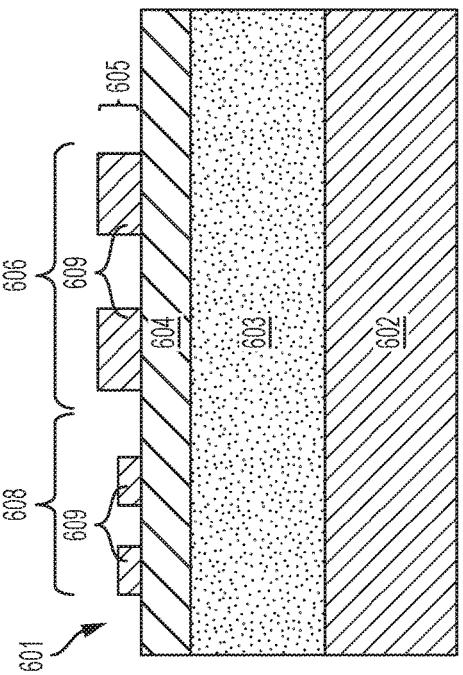
FIG. 6

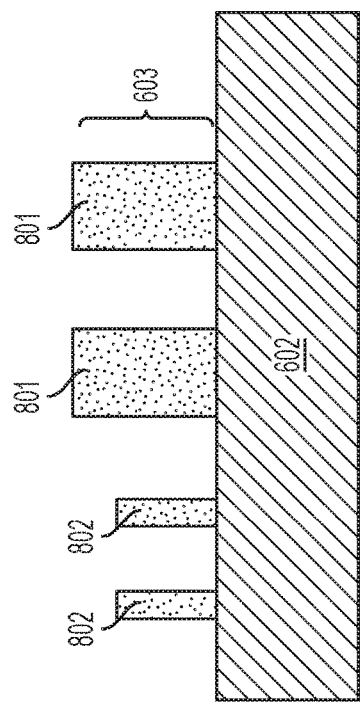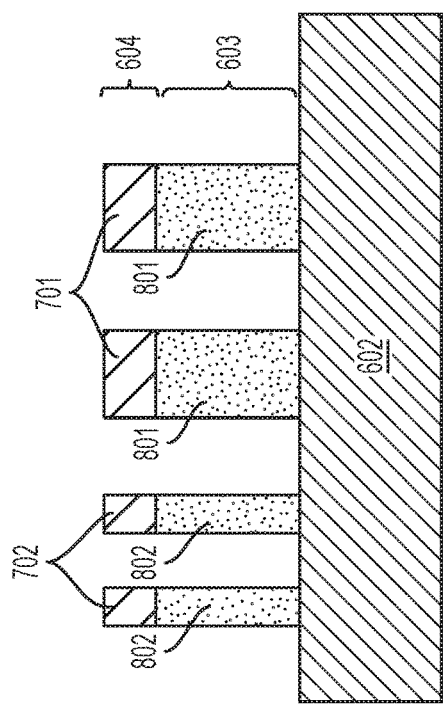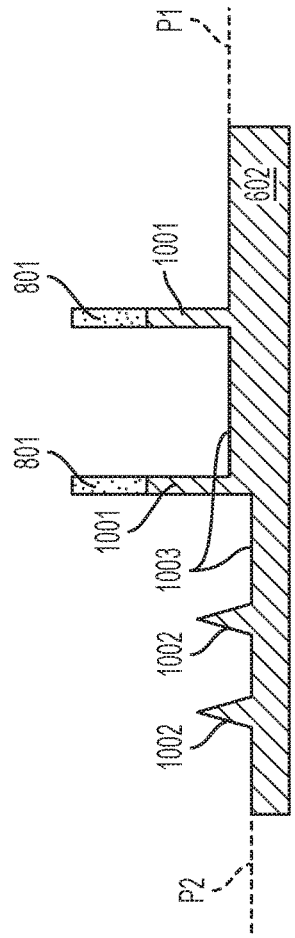

WAFER ELEMENT WITH AN ADJUSTED
PRINT RESOLUTION ASSIST FEATURE

BACKGROUND

The present invention generally relates to wafer fabrication and, more specifically, to a wafer element fabrication method to form a wafer element with an adjusted print resolution assist feature (APRAF) in order to create a smaller APRAF shape and to thereby improve planarization and to reduce stresses, for examples.

Wafer fabrication refers to repeated and/or sequential processes that are performed to produce complete electrical or photonic circuits. Examples of such electrical or photonic circuits include those with radio frequency (RF) amplifiers and light emitting diodes (LEDs). Wafer fabrication can also be used to build optical computer components and central processing units (CPUs) for computers.

SUMMARY

Embodiments of the present invention are directed to a wafer element fabrication method. A non-limiting example of the wafer element fabrication method includes forming a device element on a substrate such that the device element includes an upper surface and a sidewall extending from the upper surface to the substrate. The non-limiting example of the wafer element fabrication method further includes forming an adjusted print resolution assist feature (APRAF) on the substrate such that the APRAF is smaller than the device element in at least one dimension. In addition, the non-limiting example of the wafer element fabrication method includes depositing surrounding material, which is different from materials of the APRAF, to surround the APRAF and to lie on the upper surface in abutment with the sidewall of the device element.

Embodiments of the present invention are directed to a wafer element fabrication method. A non-limiting example of the wafer element fabrication method includes patterning photoresist (PR) over an anti-reflective coating (ARC) disposed over a planarization layer (PL) and a substrate. The patterning includes forming the PR into PR device element and adjusted print resolution assist feature (APRAF) sections having first and second dimensions, respectively. The non-limiting example of the wafer element fabrication method further includes removing portions of the ARC and the PR device element and APRAF sections such that ARC device element and APRAF posts remain underneath remainders of the PR device element and APRAF sections having third and fourth dimensions based on the first and second dimensions, respectively. In addition, the non-limiting example of the wafer element fabrication method includes removing the remainders of the PR device element and APRAF sections and portions of the PL such that PL device element and APRAF posts remain underneath the ARC device element and APRAF posts and removing the ARC device element and APRAF posts such that the PL device element and APRAF posts remain with fifth and sixth dimensions based on the third and fourth dimensions, respectively.

Embodiments of the present invention are directed to a wafer element. A non-limiting example of the wafer element includes a substrate, a device element and an adjusted print resolution assist feature (APRAF). The device element is formed on the substrate and includes an upper surface and a sidewall extending from the upper surface to the substrate. The APRAF is formed on the substrate proximate to the device element and is smaller than the device element in at least one dimension. The non-limiting example of the wafer element further includes surrounding material, which is different from materials of the APRAF, disposed to surround the APRAF and to lie on the upper surface in abutment with the sidewall of the device element.

Embodiments of the present invention are directed to a wafer element. A non-limiting example of the wafer element includes a substrate, a device element and adjusted print resolution assist features (APRAFs). The device element is formed on the substrate and includes an upper surface and a sidewall extending from the upper surface to the substrate. The APRAFs are formed on the substrate proximate to the device element and are arrayed with increasing distance (i.e., in a direction extending away) from the sidewall. Each APRAF is smaller than the device element in at least one dimension. The non-limiting example of the wafer element further includes surrounding material, which is different from materials of the APRAFs, disposed to surround the APRAFs and to lie on the upper surface in abutment with the sidewall of the device element. The surrounding material includes a relatively flat uppermost surface extending over respective portions of the device element and the APRAFs.

Embodiments of the present invention are directed to a wafer element. A non-limiting example of the wafer element includes a substrate, a device element and adjusted print resolution assist features (APRAFs). The device element is formed on the substrate and includes an upper surface and a sidewall extending from the upper surface to the substrate to surround an open region. The APRAFs are formed on the substrate proximate to the device element and are arrayed within the open region. Each APRAF is smaller than the device element in at least one dimension. The non-limiting example of the wafer element further includes surrounding material disposed to surround the APRAFs and to lie on the upper surface in abutment with the sidewall of the device element. The surrounding material includes a relatively flat uppermost surface extending over respective portions of the device element and the APRAFs.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a to-down view of a wafer element with adjusted print resolution assist features (APRAFs) in accordance with one or more embodiments of the present invention;

FIG. 2 depicts a side view of the wafer element of FIG. 1 with the APRAFs in accordance with one or more embodiments of the present invention;

FIG. 3 depicts a top-down view of a wafer element with adjusted print resolution assist features (APRAFs) in accordance with one or more embodiments of the present invention;

FIG. 4 depicts a side view of the wafer element of FIG. 3 with the APRAFs in accordance with one or more embodiments of the present invention;

FIG. 5 is a flow diagram illustration a method of wafer element fabrication in accordance with one or more embodiments of the present invention;

FIG. 6 depicts a first stage of wafer element fabrication in accordance with one or more embodiments of the present invention;

FIG. 7 depicts a first intermediate stage of wafer element fabrication in accordance with one or more embodiments of the present invention;

FIG. 8 depicts a second intermediate stage of wafer element fabrication in accordance with one or more embodiments of the present invention;

FIG. 9 depicts a third intermediate stage of wafer element fabrication in accordance with one or more embodiments of the present invention; and FIG. 10 depicts a late stage of wafer element fabrication in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, wafer fabrication processes typically relate to lithographic edge elements and reactive ion etch (RIE) elements that are disposed in open wafer regions. The lithographic edge elements are formed from lithographic processes at or near wafer edges whereas the RIE elements are generally formed by RIE or other etching processes between or within other features that are formed by, for example, lithography. In both cases, the wafer fabrication processes are routinely updated or improved to avoid issues that arise during conventional approaches. For example, the lithographic edge elements are generally located near wafer edges and tend to cause cracking or loss of planarization of overlying dielectric materials. Similarly, RIE elements in open wafer regions can cause or lead to the incidence of lateral stresses.

Turning now to an overview of the aspects of the invention, one or more embodiments of the invention address the above-described shortcomings of the prior art by providing for a wafer element and a wafer element fabrication method. The wafer element includes a substrate, a device element and an adjusted print resolution assist feature (APRAF). The device element is formed on the substrate and includes an upper surface and a sidewall extending from the upper surface to the substrate. The APRAF is formed on the substrate and is smaller than the device element in at least one dimension. The wafer element further includes surrounding material, which is different from materials of the APRAF, disposed to surround the APRAF and configured to lie on the upper surface and abut the sidewall of the device element.

While print resolution assist features (PRAFs) are elements designed on the masks or reticules to help develop isolation and uniform densities of main features, the above-described aspects of the invention address the shortcomings of the prior art by positioning the APRAF at or near lithographic edge elements or within open wafer regions. In the former case, the APRAF serves to improve uniform lithographic transfer from the mask onto the substrate. In addition, with normal use of the PRAF, adjusted APRAF sizes allow for reductions in incidence of lateral stress and additionally allow for reductions in cracking and improved planarization. Turning now to a more detailed description of aspects of the present invention, FIGS. 1 and 2 and FIGS. 3 and 4 depict wafer elements 10 and 20, respectively.

As shown in FIGS. 1 and 2, the wafer element 10 includes a substrate 11, a device element 12, one or more APRAFs 13 and surrounding material 14. The device element 12 could be any electrical or photonic element and is formed on an uppermost surface of the substrate 11 and includes a body 120 with an upper surface 121 and a sidewall 122. The sidewall 122 extends substantially vertically from the upper surface 121 to the uppermost surface of the substrate 11 to surround an open region 15 on multiple sides. The open region 15 can be formed as a result of RIE processing or other similar processing whereby the device element 12 can be regarded as an RIE element.

The one or more APRAFs 13 are formed on the uppermost surface of the substrate 11 at locations which are proximate to the device element 12 and are arrayed within the open region 15. For the case of the one or more APRAFs 13 being configured as multiple APRAFs 13, the multiple APRAFs 13 can be arrayed in one or more uniform or staggered rows and columns within the open region 15. In any case, each of the one or more APRAFs 13 is smaller than the device element 12 in at least one dimension.

The surrounding material 14 may be formed of material which is different from that of the device element 12 and the one or more APRAFs 13 and is disposed to surround the one or more APRAFs 13 and to lie on the upper surface 121 in abutment with the sidewall 122. As such, the surrounding material 14 includes a relatively flat uppermost surface 140 that extends over respective portions of the device element 12 and the one or more APRAFs 13.

In accordance with one or more embodiments of the present invention, the device element 12 and the one or more APRAFs 13 can include or be formed of similar materials, such as silicon or other semiconductor materials, and the surrounding material 14 can include dielectric material, such as planarization oxide or other suitable oxides. In accordance with one or more additional embodiments of the present invention, each of the one or more APRAFs 13 can be tapered and can be shorter or substantially shorter, as measured from the uppermost surface of the substrate 11, than the device element 12. For the tapering, each of the one or more APRAFs 13 can include a relatively wide base at or near the uppermost surface of the substrate 11 and a narrow or pointed tip disposed above the uppermost surface of the substrate 11. The relatively wide base can be rectangular (see FIG. 2) or annular.

With the configuration of FIGS. 1 and 2, the one or more APRAFs 13 serve(s) to reduce the incidence of lateral stress, improve planarization and/or reduce cracking, which could otherwise affect the wafer element 10, arising from a deposition or disposition of the dielectric material 14. An additional advantage of the one or more APRAFs 13 that is especially noticeable where the open region 15 is relatively large and/or when a number of the one or more APRAFs 13 is relative large is that a planarization of the relatively flat uppermost surface 140 of the dielectric material 14 can be improved.

As shown in FIGS. 3 and 4, the wafer element 20 includes a substrate 21, a device element 22, one or more APRAFs 23 and surrounding material 24. The device element 22 could be any electrical or photonic element and is formed on an uppermost surface of the substrate 21 near or proximate to an edge 210 thereof. The device element 22 includes a body 220 with an upper surface 221 and a sidewall 222. The sidewall 222 extends substantially vertically from the upper surface 221 to the uppermost surface of the substrate 21. The device element 22 can be formed as a result of lithographic processing or other similar processing at or near the edge 210 whereby the device element 22 can be regarded as a lithographic edge element.

The one or more APRAFs 23 are formed on the uppermost surface of the substrate 21 at locations which are proximate to the device element 22 and are arrayed with increasing distance (i.e., in a direction extending away) from the sidewall 222. For the case of the one or more APRAFs 23 being configured as multiple APRAFs 23, the multiple APRAFs 23 can be arrayed in the direction extending away from the sidewall 222 in one or more uniform or staggered rows and columns. In any case, each of the one or more APRAFs 23 is smaller than the device element 22 in at least one dimension.

The surrounding material 24 is disposed to surround the one or more APRAFs 23 and to lie on the upper surface 221 in abutment with the sidewall 222. As such, the surrounding material 24 includes a relatively flat uppermost surface 240 that extends over respective portions of the device element 22 and the one or more APRAFs 23.

In accordance with one or more embodiments of the present invention, the device element 22 and the one or more APRAFs 23 can include or be formed of similar materials, such as silicon or other semiconductor materials, and the surrounding material 24 can include dielectric material, such as planarization oxide or other suitable oxides. In accordance with one or more additional embodiments of the present invention, each of the one or more APRAFs 23 can be tapered and can be shorter or substantially shorter, as measured from the uppermost surface of the substrate 21, than the device element 22. For the tapering, each of the one or more APRAFs 23 can include a relatively wide base at or near the uppermost surface of the substrate 21 and a narrow or pointed tip disposed above the uppermost surface of the substrate 21. The relatively wide base can be angular or rectangular (see FIG. 4) or annular.

With the configuration of FIGS. 3 and 4, the one or more APRAFs 23 serve(s) to prevent cracking at or near the edge 110 and to improve planarization of the relatively flat uppermost surface 140 of the surrounding material 14 especially with increasing distance from the sidewall 222.

With reference to FIG. 5, a wafer element fabrication method which is useful in fabricating the wafer elements 10 and 20 of FIGS. 1 and 2 and FIGS. 3 and 4, respectively, is provided. As shown in FIG. 5, the wafer element fabrication method includes forming the device element 12, 22 on a substrate 11, 21 such that the device element 12, 22 includes the upper surface 121, 221 and a sidewall 221, 222 extending from the upper surface 121, 221 to the substrate 11, 21 (501). As shown in FIG. 5, the wafer element fabrication method further includes forming an APRAF 13, 23 on the substrate 11, 21 proximate to the device element 12, 22 such that the APRAF 13, 23 is smaller than the device element 12, 22 in at least one dimension (502). In addition, as shown in FIG. 5, the wafer element fabrication method further includes depositing the surrounding material 14, 24 so as to surround the APRAF 13, 23 and to lie on the upper surface 121, 221 in abutment with sidewall 122, 222 of the device element 12, 22 (503).

With reference to FIGS. 6-10, a wafer element fabrication method is provided to produce either of the wafer elements 10 and 20 of FIGS. 1 and 2 and FIGS. 3 and 4.

As shown in FIG. 6, the wafer element fabrication method initially includes formation of a wafer 601. The wafer 601 includes a substrate 602 or hardmask, a planarization layer (PL) 603, a mask layer 604 and a photoresist (PR) 605. The substrate 602 can be formed of or include silicon or other similar semiconductor materials. The PL 603 can be formed of or include organic planarization materials, such as planarization oxide or other similar oxides. The mask layer 604 can be configured as an anti-reflective coating (ARC) or as a silicon anti-reflective coating (SiARC) and will be hereinafter and interchangeably referred to as an ARC 604 or as an SiARC 604. The PR 605 is patterned over the SiARC 604 with the SiARC 604 disposed over the PL 603 and with the PL disposed over the substrate 602.

In accordance with one or more embodiments of the present invention, a patterning of the PR 605 can include forming a first portion 606 of the PR 605 into multiple PR device element sections 607 and forming a second portion 608 of the PR 605 into multiple PR APRAF sections 609. Here, the multiple PR device element sections 607 are located at or near to eventual locations of device elements (i.e., the device elements 12, 22 of FIGS. 1 and 2 and FIGS. 3 and 4, respectively) and have first sets of dimensions. Conversely, the multiple PR APRAF sections 609 are located at or near to eventual locations of APRAFs (i.e., the one or more APRAFs 13, 23 of FIGS. 1 and 2 and FIGS. 3 and 4, respectively) and have second sets of dimensions. The second sets of dimensions are generally smaller or lesser as compared to the first sets of dimensions which will lead to the eventual formation of the APRAFs being smaller than the device elements.

As shown in FIG. 7, the wafer element fabrication method next includes a removal of respective portions of the ARC 604 (or the SiARC 604), the multiple PR device element sections 607 and the multiple PR APRAF sections 609. Here, the removal can be conducted as a SIARC open operation at those portions of the ARC 604 that are exposed by the multiple PR device element sections 607 and the multiple PR APRAF sections 609. In any case, while the removal can lead to erosion or loss in the critical dimensions (CDs) of the multiple PR device element sections 607 and the multiple PR APRAF sections 609, such erosion or loss can be more pronounced in the lateral dimensions at the multiple PR APRAF sections 609. Thus, the multiple PR APRAF sections 609 can be reduced in size by a greater degree than the multiple PR device element sections 607 during the removal operations.

Upon completion of the removal, ARC device element posts 701 remain disposed underneath the remainders of the PR device element sections 607 and ARC APRAF posts 702 remain disposed underneath the remainders of the PR APRAF sections 609. At this point, the PR device element sections 607 have third sets of dimensions that are based on the first sets of dimensions owing to the size reduction resulting from the removal operations. Similarly, the PR APRAF sections 609 have fourth sets of dimensions that are based on the second sets of dimensions again owing to the size reduction resulting from the removal operations.

In particular, at this point, the remainders of the PR device element sections 607 can be somewhat shorter and slightly narrower than they were when they were initially patterned. By contrast, the remainders of the PR APRAF sections 609 can be substantially shorter and narrower than they were when they were initially patterned. Thus, the remainders of the PR device element sections 607 can have first widths that are wider than widths of the remainders of the PR APRAF sections 609.

As shown in FIG. 8, the wafer fabrication method next includes a removal of the remainders of the PR device element sections 607 and the PR APRAF sections 609 as well as a removal of portions of the PL 603 that are exposed by the ARC device element posts 701 and the ARC APRAF posts 702. Here, the removal can be conducted as an PL open operation and is selective to the material of the PL 603 such that there is little to no change in dimensions (i.e., the CDs) of the ARC device element posts 701 and the ARC APRAF posts 702. As a result of the removal, PL device element posts 801 will remain underneath the ARC device element posts 701 and PL APRAF posts 802 will remain underneath the ARC APRAF posts 702. In addition, since there will be little to no change in dimensions of the ARC device element posts 701 and the ARC APRAF posts 702, the ARC device element posts 701 and the PL device element posts 801 will have widths in correspondence with the widths of the remainders of the PR device element sections 607 following the ARC removal. Similarly, the ARC APRAF posts 702 and the PL APRAF posts 802 will have widths in correspondence with the widths of the remainders of the PR APRAF sections 609 following the ARC removal.

A next stage in the wafer element fabrication method is shown in FIG. 9 and includes a removal of the ARC device element posts 701 and the ARC APRAF posts 702. Such removal can be conducted as a SiARC burn-off process and will result in reductions in the respective sizes of the PL device element posts 801 and the PL APRAF posts 802. Thus, the PL device element posts 801 will remain with fifth sets of dimensions that are based on the third sets of dimensions and the PL APRAF posts 802 will remain with sixth sets of dimensions that are based on the fourth sets of dimensions. In an exemplary case, the PL device element posts 801 could have heights and widths that are relatively unchanged whereas the PL APRAF posts 802 could have reduced heights and widths.

Thus, at this point, while the PL device element posts 801 can be substantially similar in size as they were prior to the SiARC burn-off processing, the PL APRAF posts 802 can be substantially shorter and narrower than they were prior to the SiARC burn-off processing. This can be due to the fact that the SiARC burn-off processing tends to have a greater and more noticeable effect on small-surface area and isolated features, such as the PL APRAF posts 802, as compared to large surface area features, such as the PL device element posts 801.

As shown in FIG. 10, the wafer element fabrication method is completed by execution of an etching process with respect to the substrate 602, upper portions of the PL device element posts 801 and the PL APRAF posts 802. Such execution leads to erosion of the PL device element posts 801 in the height and width dimensions, complete removal of the PL APRAF posts 802 and to erosion of the substrate 602. In an exemplary case, the erosion of the substrate 602 can result in the substrate 602 forming posts device element posts 1001 underneath remainders of the PL device element posts 801 and APRAFs 1002 located at lateral positions of the former PL APRAF posts 802. Here, the substrate 602 can also include an uppermost surface 1003 at a first plane P1 in and around the device element posts 1001 and at a second plane P2, which is recessed from the first plane P1, in an around the APRAFs 1002.

In accordance with one or more embodiments of the present invention, the execution of the etching can result in the APRAFs 1002 being conical, trapezoidal or pyramidal and at least being shorter than the device element posts 1001 as measured from the uppermost surface 1003 even if the recession of second plane P2 is taken into account. In addition, as noted above, the APRAFs 1002 can be arrayed in staggered or uniform rows and columns as a result of the execution of the etching.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A wafer element, comprising:
a substrate comprising an upper substrate surface;
a single device element formed directly on the upper substrate surface and comprising an upper device element surface and a sidewall extending exclusively vertically in a height dimension from the upper device element surface to the upper substrate surface;
an adjusted print resolution assist feature (APRAF) formed directly on the upper substrate surface proximate to the single device element, the APRAF being:
smaller than the single device element in at least the height dimension as measured from an uppermost portion thereof to the upper substrate surface, and
tapered with a wide base at the upper substrate surface and a pointed tip at the uppermost portion; and
oxide disposed to surround an entirety of the APRAF and to lie on the upper device element surface and directly on the upper substrate surface in abutment with an entirety of the sidewall of the single device element.

2. The wafer element according to claim 1, wherein the wide base is angular.

3. The wafer element according to claim 1, wherein the wide base is annular.

4. The wafer element according to claim 1, wherein:
the single device element comprises a lithographic edge element,
the oxide comprises an entirely flat uppermost surface extending over respective portions of the single device element and the APRAF and extending over regions defined between the single device element and the APRAF, and
the APRAF is configured as multiple APRAFs arrayed with increasing distance from the sidewall.

5. The wafer element according to claim 1, wherein:
the single device element comprises a reactive-ion-etch-formed (RIE-formed) feature,
the oxide comprises an entirely flat uppermost surface extending over respective portions of the single device element and the APRAF and extending over regions defined between the single device element and the APRAF, and
the sidewall surrounds an open region with the APRAF configured as multiple APRAFs arrayed within the open region.

6. A wafer element, comprising:
a substrate comprising an upper substrate surface;
a single device element formed directly on the upper substrate surface and comprising an upper device element surface and a sidewall extending exclusively vertically in a height dimension from the upper device element surface to the upper substrate surface;
adjusted print resolution assist features (APRAFs) formed directly on the upper substrate surface proximate to the single device element and arrayed with increasing distance from the sidewall,
each APRAF being:
smaller than the single device element in at least the height dimension as measured from an uppermost portion thereof to the upper substrate surface, and
tapered with a wide base at the upper substrate surface and a pointed tip at the uppermost portion; and
oxide disposed to surround respective entireties of the APRAFs and to lie on the upper device element surface and directly on the upper substrate surface in abutment with an entirety of the sidewall of the single device element,
the oxide comprising an entirely flat uppermost surface extending over respective portions of the single device element and the APRAFs and extending over regions defined between the single device element and the APRAFs.

7. The wafer element according to claim 6, wherein the wide base of each APRAF is angular or annular.

8. A wafer element, comprising:
a substrate comprising an upper substrate surface;
a single device element formed directly on the substrate and comprising an upper device element surface and a sidewall extending exclusively vertically in a height dimension from the upper device element surface to the upper substrate surface to surround an open region;
adjusted print resolution assist features (APRAFs) formed directly on the upper substrate surface proximate to the single device element and arrayed within the open region,
each APRAF being:
smaller than the single device element in at least the height dimension as measured from an uppermost portion thereof to the upper substrate surface, and
tapered with a wide base at the upper substrate surface and a pointed tip at the uppermost portion; and
oxide disposed to surround respective entireties of the APRAFs and to lie on the upper device element surface and directly on the upper substrate surface in abutment with an entirety of the sidewall of the single device element,
the oxide comprising an entirely flat uppermost surface extending over respective portions of the single device element and the APRAFs and extending over regions defined between the single device element and the APRAFs.

9. The wafer element according to claim 8, wherein the wide base of each APRAF is angular or annular.

10. A wafer element, comprising:
a substrate comprising an upper substrate surface;
a single device element formed directly on the substrate and comprising an upper device element surface and a sidewall extending exclusively vertically in a height dimension from the upper device element surface to the upper substrate surface to surround an open region;
adjusted print resolution assist features (APRAFs) formed directly on the upper substrate surface proximate to the single device element and arrayed within the open region; and
oxide disposed to surround respective entireties of the APRAFs and to lie on the upper device element surface and directly on the upper substrate surface in abutment with an entirety of the sidewall of the single device element, the oxide being disposed in a portion of the open region between the sidewall of the single device element and one of the APRAFs closest to the sidewall of the single device element with an absence of materials other than the oxide and comprising an entirely flat uppermost surface extending over respective portions of the single device element and the APRAFs and extending over regions defined between the single device element and the APRAFs.

\* \* \* \* \*